United States Patent
Cheah et al.

(10) Patent No.: US 9,889,967 B2
(45) Date of Patent: Feb. 13, 2018

(54) STRIPPABLE HYBRID TRAY SYSTEM FOR ELECTRONIC DEVICES

(75) Inventors: Leong Chow Cheah, Penang (MY); Hong Yung Bee, Penang (MY); Muda Alang @ Sabri Bin Ahmad, Penang (MY)

(73) Assignee: ILLINOIS TOOL WORKS INC., Glenview, IL (US)

( * ) Notice: Subject to any disclaimer, the term of this patent is extended or adjusted under 35 U.S.C. 154(b) by 1475 days.

(21) Appl. No.: 13/634,059

(22) PCT Filed: Mar. 4, 2011

(86) PCT No.: PCT/US2011/027240
§ 371 (c)(1),
(2), (4) Date: Jan. 28, 2013

(87) PCT Pub. No.: WO2011/112461
PCT Pub. Date: Sep. 15, 2011

(65) Prior Publication Data
US 2013/0118124 A1  May 16, 2013

(30) Foreign Application Priority Data

Mar. 12, 2010  (MY) .............................. 2010001085

(51) Int. Cl.
*H05K 13/00* (2006.01)
*B65D 25/10* (2006.01)
*B65D 85/00* (2006.01)

(52) U.S. Cl.
CPC ............. *B65D 25/10* (2013.01); *B65D 85/00* (2013.01); *H05K 13/0084* (2013.01); *H05K 13/00* (2013.01); *Y10T 29/49002* (2015.01)

(58) Field of Classification Search
CPC .............. H05K 13/00; H05K 13/0084; H05K 13/0069; H05K 13/0061; B65D 25/10; B65D 25/108; B65D 52/107

(Continued)

(56) References Cited

U.S. PATENT DOCUMENTS 5,103,976 A * 4/1992 Murphy ............ H01L 21/67333
                                                    206/509
5,361,901 A * 11/1994 Schenz .............. H05K 13/0417
                                                    206/714

(Continued)

FOREIGN PATENT DOCUMENTS

WO         0211186 A2     2/2002
WO      2008091460 A1     7/2008

OTHER PUBLICATIONS

An International Search Report and Written Opinion, dated May 4, 2011 in International Application No. PCT/US2011/027240.

*Primary Examiner* — Steven A. Reynolds
(74) *Attorney, Agent, or Firm* — Hauptman Ham, LLP

(57) ABSTRACT

A component tray system, the system including a tray having one or more pockets, each pocket adapted to receive at least one component, and a removable, thermoformed sheet adapted to cooperate with said tray to reduce at least the depth of said on or more pockets. In some embodiments, the tray has a top surface and a bottom surface, pockets being defined on either or both of the top and bottom surfaces. In some embodiments, the thermoformed sheet is adapted to cooperate with the top surface or the bottom surface.

30 Claims, 13 Drawing Sheets

(58) Field of Classification Search
USPC ....... 206/706, 712, 707, 523, 583, 594, 710, 206/722; 569/305; 269/305
See application file for complete search history.

(56) References Cited

U.S. PATENT DOCUMENTS

| | | | | |
|---|---|---|---|---|
| 5,547,082 | A * | 8/1996 | Royer | H05K 13/0084 206/564 |
| 6,036,023 | A * | 3/2000 | Pfahnl | G01R 31/2867 206/714 |
| 6,109,445 | A * | 8/2000 | Beyer | H05K 13/0084 206/561 |
| 6,112,795 | A | 9/2000 | Emmett et al. | |
| 6,227,372 | B1 * | 5/2001 | Thomas | H01L 21/67336 206/454 |
| 6,497,932 | B1 * | 12/2002 | Munch | B08B 17/06 206/725 |
| 6,612,442 | B2 * | 9/2003 | Soh | H01L 21/67333 206/725 |
| 7,476,960 | B2 * | 1/2009 | Cruz | H01L 21/67333 211/41.18 |
| 8,964,404 | B2 * | 2/2015 | Poetzinger | G01R 1/0425 206/701 |
| 9,048,272 | B2 * | 6/2015 | Forsyth | B29C 65/561 |
| 2004/0099568 | A1 * | 5/2004 | Zhang | B65D 21/0209 206/707 |
| 2004/0112791 | A1 * | 6/2004 | Zhang | H05K 7/026 206/706 |
| 2005/0072714 | A1 | 4/2005 | Eleveld | |
| 2005/0072715 | A1 | 4/2005 | Pylant et al. | |
| 2005/0133404 | A1 | 6/2005 | White, Jr. | |
| 2007/0215517 | A1 * | 9/2007 | Holler | H01L 21/67333 206/725 |
| 2008/0173569 | A1 | 7/2008 | Forsyth | |
| 2010/0089851 | A1 * | 4/2010 | Slaughter | B29C 65/561 211/126.2 |
| 2011/0290701 | A1 * | 12/2011 | Bennett | H05K 13/0084 206/725 |

* cited by examiner

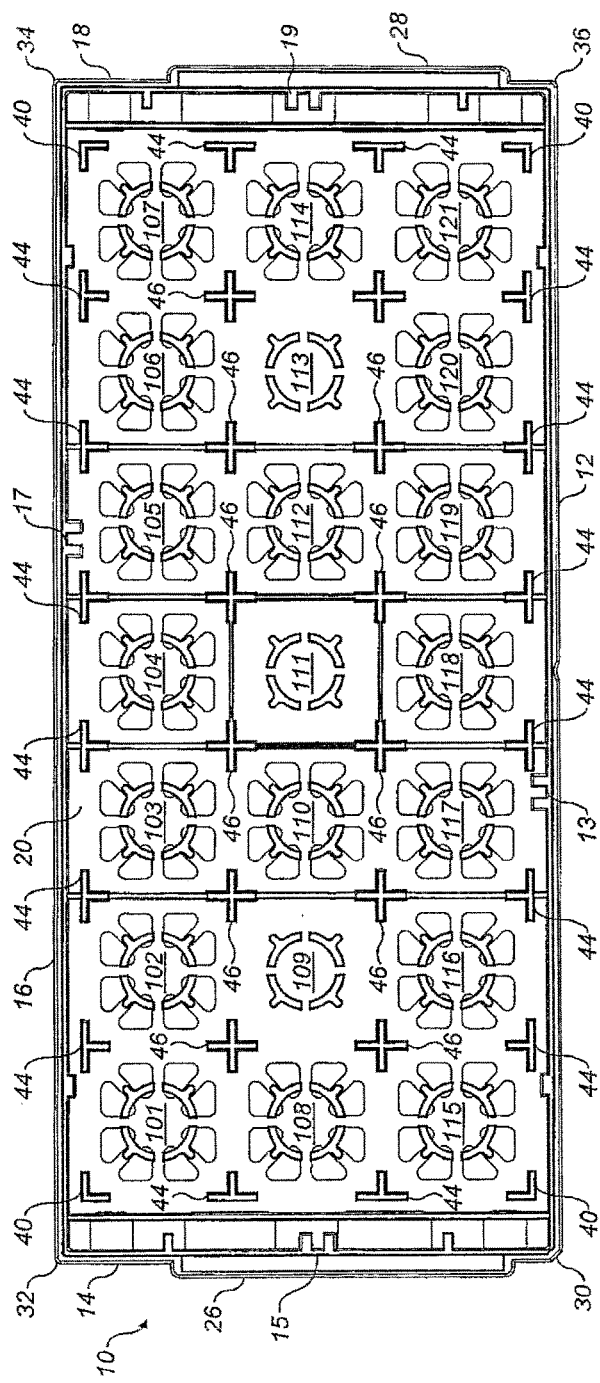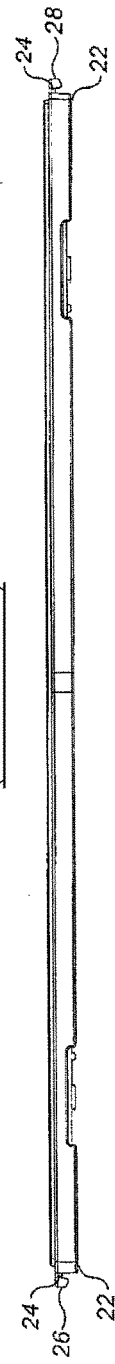
FIG. 5
(PRIOR ART)
FIG. 6
(PRIOR ART)

STRIPPABLE HYBRID TRAY SYSTEM FOR ELECTRONIC DEVICES

RELATED APPLICATIONS

The present application is based on International Application No. PCT/US2011/027240, filed Mar. 4, 2011 and claims priority from, Malaysian Application Number 2010001085, filed Mar. 12, 2010.

BACKGROUND TO THE INVENTION

Trays made from injection moulding are commonplace in the Integrated Circuit (IC) and semiconductor industries for transporting sensitive components. These trays are covered by various industry standards, such as JEDEC, EIAJ, EIA and others.

The trays are manufactured using injection moulding in various polymers, for example, PPO, PPE, PP, PC, PSU, PES, PAS and ABS. The polymers are usually filled to provide strength and conductivity. Various materials are often used such as talc, carbon fibre, carbon powder, metal fibre and the other usual polymer fillers.

The most common use of the trays is in transporting and protecting the components through the stages of assembly, test and distribution. Each tray contains pockets, each pocket designed to accept a component. The component sits securely in the pocket, with as little free movement as possible. Within each tray, the pockets are arranged in a rectangular matrix and with a regular pitch, according to the standard, in order to facilitate robot pick and place operations. A tray will typically be able to hold between 1 and 2,500 components, depending on the size of the component and the pitch of the rectangular matrix. New trays are often designed for every requirement, e.g. component size and type.

Each tray has features defining pockets on both the top and bottom surfaces. In this way a single tray can securely hold a component in X and Y planes, to present the component for inspection or processing, in a "live bug" or "dead bug" orientation, depending on which side of the tray is used to hold the component.

Each tray is designed so as to be static dissipative or conductive. They conduct electrically to a certain specification and will dissipate static charges, thereby protecting the components stored within the pockets from the adverse effects of any static charges.

So far, the component trays have been discussed individually. When used in combination, two similar trays can provide enhanced transport protection by creating a 3D enclosure surrounding the component. The pocket on the bottom side of the first tray cooperates with the pocket on the facing top side of the second tray, each pocket thus being one half of the whole pocket or 3D enclosure surrounding the component. To avoid ambiguity, the whole pocket defined by the cooperative pockets of the top and bottom surfaces of adjacent trays will hereafter be referred to as the 3D enclosure. Two trays, in a stacked pair, thus provide transport protection in both horizontal and vertical planes.

When designing these injection moulded trays, the size of the pocket must conform as closely as possible to the size of the component it is designed to carry. In this way, the free movement of the component is reduced in both horizontal and vertical directions, preventing damage to the component. However, in order to accommodate manufacturing tolerances both of the components and the trays, the pockets are designed to be slightly larger than the components they are designed to carry. There should be free play between the component and the pocket inner walls. The oversized pockets are sized in such a way that the component does not fall from any seating ledges that may be present in the pocket due to too wide a gap and is not prevented from fully going down into the pocket. In general, all pocket designs incorporate a taper or draft angle on the walls (whether by intention or by way of the injection molding process). The molding process necessitates a usual draft taper of 5 degrees, and anything larger than that is intentional design. The wall taper ensures that the component automatically self-aligns or self-centers, and/or falls squarely into the central portion of the pocket and onto the seating ledges, where provided.

Typically, one tray is designed to fit one specific type or size of component. Some trays however, are designed to protect multiple types and sizes of component. As the tray system through the 3D enclosures provides 3-dimensional protection, to protect multiple components compromises must be made. These include an inefficient use of available space, too much free movement of the component within the pockets or 3D enclosures thus affording less protection to the component, or a loss of rigidity of the tray, again decreasing the afforded protection.

In some cases, the size of the component will vary during different stages of production as they progress down the assembly line process, from the addition or assembly of sub-components and materials that add to or subtract from the initial component. The tray must be able to adequately protect the largest size of component during production, however must also provide adequate protection during smaller phases. Manufacturing multiple trays for each stage is not only cost intensive but also space consuming and inconvenient in terms of having to use separate trays for each stage.

Various solutions have been proposed to counteract this issue, each with inherent downfalls. One method, as described in U.S. Pat. No. 6,612,442, is to manufacture the trays using a thermoforming process, rather than injection moulding. The trays provide storage and cost savings over injection moulded trays, however suffer from a lack of rigidity inherent in thermoformed products.

An injection moulded peripheral frame can be used to provide a modicum of rigidity, as is also described in U.S. Pat. No. 5,547,082. These solutions suffer from a tendency for the pockets to lose their shape. By using a peripheral, featureless frame, the thermoformed sheet is not held securely and the sheet can 'sag', moving away from the sheet's restraining points. Protection for the components is thus compromised during transport and use, especially when the tray is used singly and not as a stacked pair.

Other solutions, such as US 2005/0072714 and US 2005/0072715, use a featureless injection moulded base tray as mentioned above, but use an injection moulded insert to provide the various pocket sizes required to house the component. Although these inserts provide a removable method of altering the pocket size for the intended purpose, they are expensive to produce, slow to design and manufacture and require a large amount of storage space.

Other methods of transporting components can be used such as tubes and carrier tape and reel, but these do not provide the protection and easy accessibility of the conventional tray system.

SUMMARY OF THE INVENTION

According to a first aspect of the present invention, there is provided a component tray system, the system comprising:

a tray having one or more pockets, the or each pocket adapted to receive at least one component; and, a removable, thermoformed sheet adapted to cooperate with said tray to reduce at least the depth of said one or more pockets.

This provides the portability and security of a standard or common component tray system but is capable of easily receiving a plurality of different sized components for each purpose required. With the addition or removal of the thermoformed sheet, the dimensions of the or each pocket for receiving the components can be altered, thereby providing a carrier for components of differing sizes without compromising transport protection.

Moreover, the costs of providing this uncompromised transport protection are reduced when compared with manufacturing a new tray with the alternative pocket dimensions. The time associated with manufacturing and inserting a replacement sheet is also markedly reduced.

Typically, the tray has a top surface and a bottom surface. The pockets may be defined on either or both of the top and bottom surfaces, in which case the thermoformed sheet is adapted to cooperate with the respective top or bottom surface.

The component tray system may further comprise a second thermoformed sheet adapted to cooperate with the other of the top surface or the bottom surface. Alternatively, the thermoformed sheet may be adapted to cooperate with both the top and bottom surfaces.

In one embodiment, the thermoformed sheet is conformal, so as to conform with the tray—typically with the top and/or bottom surface, as discussed immediately above. In this way, the rigidity of the sheet is reinforced by the tray and the sheet is held securely to the tray.

Preferably, the thermoformed sheet includes protrusions, such as bumps, studs, bosses, stand-offs, platforms or spikes to vary the profile of the sheet, thus to reduce at least the depth of said one or more pockets. These protrusions negate any potential problems caused by inaccuracy in the manufacturing process and more control over the size of the pockets is possible than simply varying the thickness of the thermoform sheet. In addition, the protrusions may also reduce the width of said one or more pockets. Optionally, the protrusions are positioned so as to contact only non-fragile portions of the at least one component when, in use, the tray is moved. In this way, the essential, sensitive portions of the component are thus left untouched and are therefore afforded greater protection.

The thermoformed sheet may include indented portions, such as channels, and/or apertures, such as slots or holes. These indented portions and/or apertures can cooperate with pocket-defining features of the tray, in order to only vary the dimensions in one or two directions. The indented portions and/or apertures can also cooperate with the electrical contact surface portions of the components to avoid contact between the sheet and those delicate portions.

The thermoformed sheet may be retained in registration with the tray by cooperative interengagement of tray features with corresponding features on the sheet. In one embodiment, the cooperative interengagement comprises a snap-fit, such as between pocket-defining features of the tray and corresponding cooperative apertures in the sheet. In another embodiment, the cooperative interengagement comprises a snug fit, such as through frictional interference between pocket-defining features of the tray and the protrusions of the sheet.

The thickness of the sheet is typically between 0.2 mm and 1.0 mm, which are envisaged to be the effective limits for acceptably accurate thermoforming of the sheet. Preferably, the sheet thickness is between 0.2 mm and 0.8 mm, which reduced upper limit is applicable where it is required to form protrusion features, and is also a practical limit on the thickness of sheet that can be fitted to a tray. More preferably, the sheet thickness is 0.3 mm, which enables good formation of protrusion features with good dimensional stability and at a low cost. In general, thermoform process variations increase with sheet thickness. Also, thin sheets are less expensive than thicker sheets.

According to another aspect of the invention, there is provided a method of manufacturing components, the method comprising the steps of:

providing a first tray having one or more pockets on a first side thereof;

providing a second tray having a first side and a second side, the second side facing the first side of the first tray;

inserting at least one first component having a first size into the or each pocket on the first side of the first tray;

attaching a removable, thermoformed sheet to the second side of the second tray;

stacking the second tray on top of the first tray such that the thermoformed sheet is in registration with said first tray thereby reducing at least the depth of said one or more pockets, the at least one first component being retained snugly there within by virtue of the sheet;

performing a manufacturing operation on said at least one first component; and removing said thermoformed sheet.

In one embodiment, the manufacturing operation simply comprises moving the stacked trays from one location to another, the first components being retained snugly within the pockets during the movement.

However, the method preferably further includes a step of removing the second tray from the first tray prior to performing the manufacturing operation, which enables the manufacturing operation to result in the production of a second component having a second size, greater than said first size. Also, it enables the sheet to be removed from the second tray.

Typically, the manufacturing operation is carried out on the first components in situ in the pockets. The sheet may be removed during or after the manufacturing operation has been performed on said at least one first component. The sheet may be removed, either by hand or by a removal mechanism, to effectively increase the pocket size, ready to receive the larger second components formed in the manufacturing operation. In an alternative manufacturing operation, the components would be removed from the pockets with a pick-and-place technique.

The at least one first component may be inserted in either a "live bug" orientation or a "dead bug" orientation.

Typically, the first and second trays are identical to one another. In this way, a single tray design can function both to form the pockets and to retain the thermoformed sheet. Also, multiple trays can be stacked on top of one another.

In one embodiment, the sheet is attached before the insertion of the at least one first component. In this way, the sheet is attached to the top surface of a tray and the first components can be inserted into the reduced sized pockets. This avoids registration problems that might occur if the first components are instead loosely inserted into the full size pockets with the sheet then being overlaid to reduce the pocket size.

A supplementary sheet may be attached to the first side of the first tray before the insertion of the at least one first component. Thus, the first components would be nestled between two sheets, providing enhanced protection and more flexibility in accommodating different sized components during their manufacturing stages.

The method may further include a step of inverting the stacked first and second trays. This might be beneficial if it is required to perform a manufacturing operation with the components in, say, a "live bug" orientation where they have been inserted in a "dead bug" configuration, or vice versa. Inversion might also be required in order to remove the or each sheet from the trays without having to remove the components from their respective pockets.

The tray and sheet required in the method may together comprise the component tray system of the first aspect of the invention.

BRIEF DESCRIPTION OF THE DRAWINGS

An example of the present invention will now be described in detail with reference to the accompanying drawings, in which:

FIG. 5 is a top plan view of the tray of FIGS. 1 to 4;

FIG. 6 is a side elevation view of the tray of FIG. 5;

DETAILED DESCRIPTION

Figure 1:
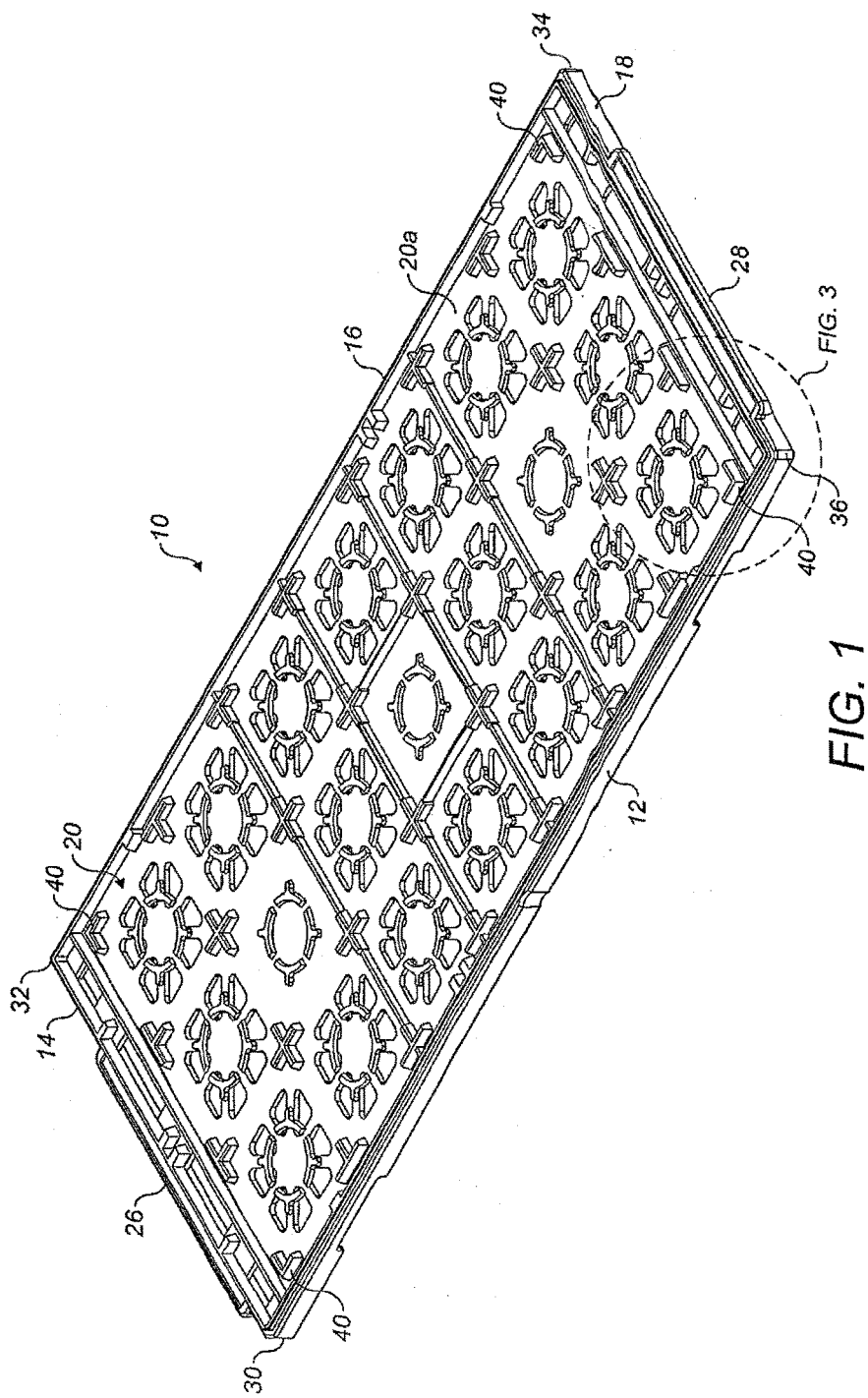
FIG. 1 shows a top perspective view of an exemplary prior art component tray conforming to the JEDEC standard.
Figure 2:
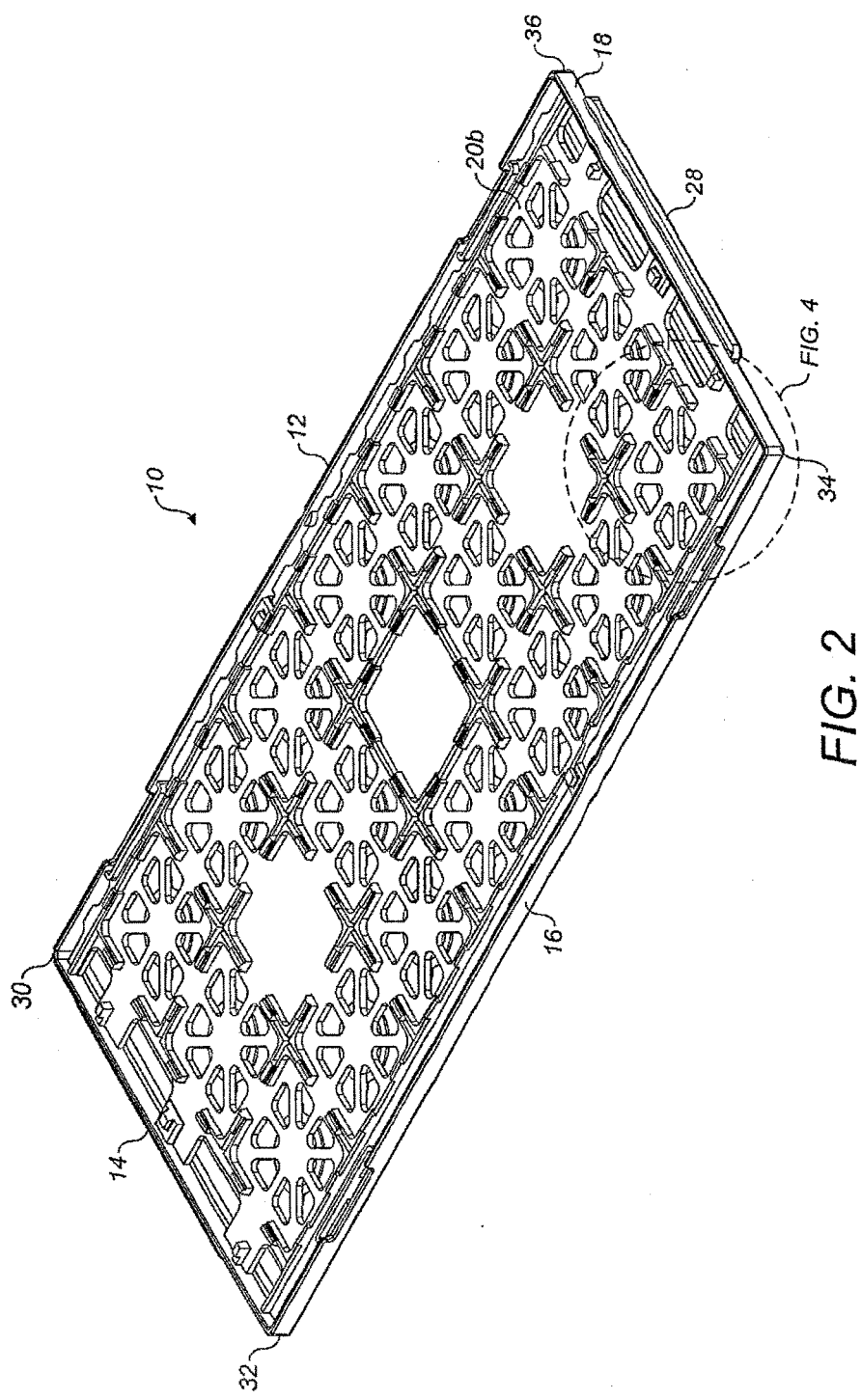
FIG. 2 is a bottom perspective view of the tray of FIG. 1.
Figure 7:
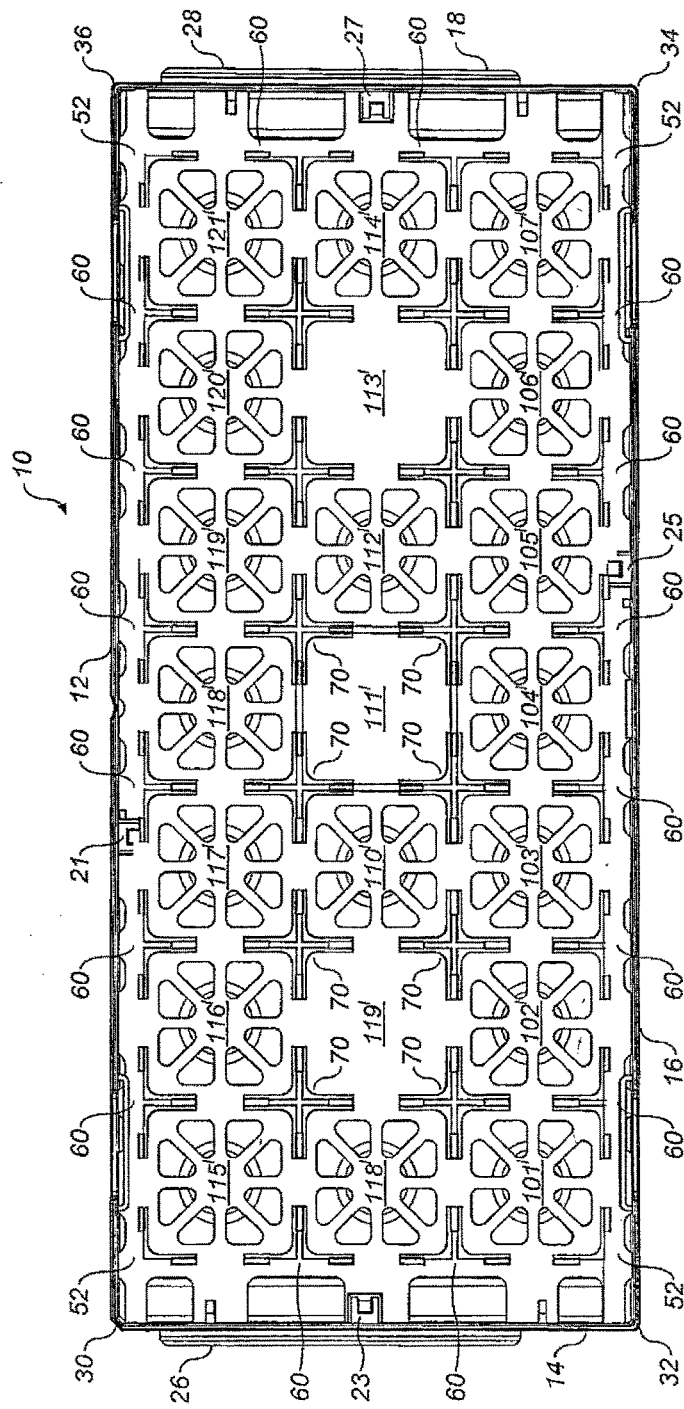
FIG. 7 is a bottom plan view of the tray of FIGS. 1 to 4.

Referring now to the drawings in detail wherein like numerals refer to like elements throughout the several views, one sees that FIG. 1 is a top perspective view of a known tray 10 suitable for use in the present invention. FIG. 2 is a bottom perspective view of the same tray 10. FIG. 5 is a top plan view of the tray 10 of the present invention and FIG. 7 is a bottom plan view of the tray 10 of the present invention. Tray 10 conforms to the standards of JEDEC and hence is bounded by long sides 12, 16 and short sides 14, 18 with interior structure provided by planar floor 20.

Sides 12, 14, 16, 18 are bounded by downwardly extending peripheral skirt 22 which further includes upper indentation 24 for receiving the peripheral skirt 22 of an upwardly adjacent tray thereby allowing the trays 10 to be stacked. Flanges 26, 28 are provided on short sides 14, 18 offset from one another in accordance with JEDEC standards to provide indication of the front and back of the tray. Additionally, as shown on FIGS. 5 and 7, the upper interior surface of sides 12, 14, 16, 18 include respective tab pairs 13, 15, 17, 19 for receiving the respective corresponding tabs 21, 23, 25, 27 on the lower interior surface of sides 12, 14, 16, 18 of a successive identical upper tray 10, thereby aligning successive trays 10 in a stacked configuration.

As noted, the entire peripheral structure, including peripheral skirt 22, upper indentation 24 and flanges 26, 28, is made in accordance with JEDEC standards to provide for standardized automated handling of tray 10.

Corner 30 is formed at the intersection of sides 12, 14. Corner 32 is formed at the intersection of sides 14, 16. Corner 34 is formed at the intersection of sides 16, 18. Corner 36 is formed at the intersection of sides 12, 18. L-shaped support elements 40 are formed on the upper surface or side (FIGS. 1, 3 and 5) inwardly adjacent from corners 30, 32, 34, 36, T-shaped support elements 44 are formed inwardly adjacent from sides 12, 14, 16, 18 on the upper surface of tray 10, and X-shaped support elements 46 are formed on the upper surface in the interior of tray 10 thereby defining storage pockets 101-121 (see FIG. 5) which are configured in rows and columns within the rectangular shape of tray 10, which could likewise be provided in a square or other shape.

Some of the storage pockets, such as those shown at 109, 111, 113 may include a solid planar floor 20 thereby forming vacuum storage pockets to permit vacuum operated equipment to couple to the tray 10 whereas the remaining storage pockets have a substantial portion of planar floor 20 removed as described below. Additionally, support elements 40, 44, 46 typically have bevelled upper (in the configuration or orientation of FIGS. 1 and 3) surfaces.

Figure 4:
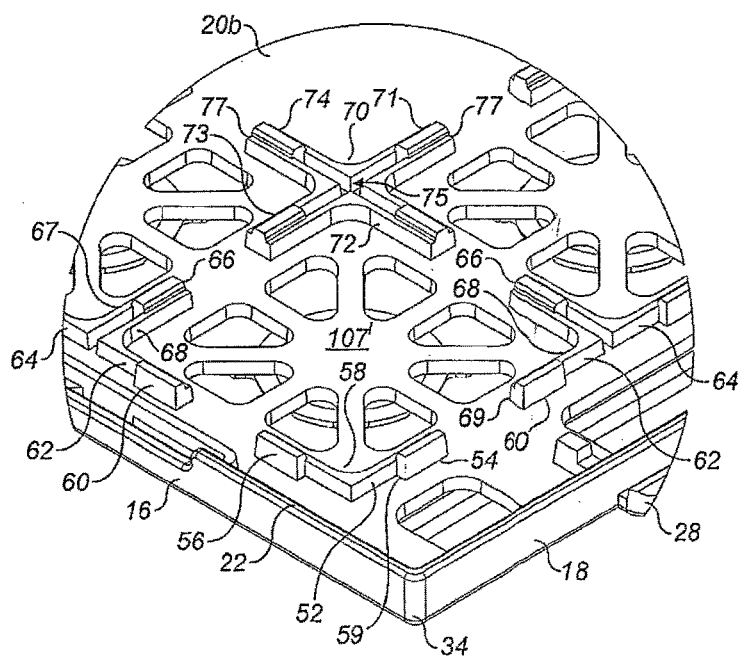
FIG. 4 shows an area of detail of FIG. 2.

As shown in FIGS. 2, 4 and 7, the lower surface or side 20b of tray 10 includes L-shaped support elements 52 inwardly adjacent from corners 30, 32, 34, 36. As best seen in FIG. 4, L-shaped support elements 52 include legs 54, 56 oriented perpendicular to each other, meeting at apex 58, with an outer portion of legs 54, 56 removed adjacent to apex 58 in order to allow the corresponding L-shaped support element 40 from the upper surface of a downwardly successive tray 10 to seat on L-shaped support element 52. Additionally, the inner portion of legs 54, 56 have a reduced height, and ledge 59 of this reduced height is formed along the interior of L-shaped support element 52. T-shaped support elements 60 are formed inwardly adjacent from sides 12, 14, 16, 18 on the lower surface 20b of tray 10. T-shaped support elements 60 are formed from collinear head segments 62, 64 which are parallel to the immediately adjacent side of the tray and further formed from segment 66 which is perpendicular to the head segments 62, 64. A portion of the interior of segment 66 immediately adjacent to the intersection 68 of segments 62, 64, 66 is removed thereby forming slot 67. Similarly, an outer portion of the collinear head segments 62, 64 immediately adjacent to the intersection 68 is removed in order, along with slot 67, to form a seat to receive the corresponding T-shaped support element 44 from the upper surface of a downwardly successive tray 10.

Additionally, the inner portion of segments 62, 64, 66 have a reduced height, and ledge 69 of this reduced height is formed on both sides of segment 66 and along the interior of segments 62, 64.

X-shaped support elements 70 are formed from four segments 71, 72, 73, 74 at successive right angles to each other, joining at centre 75. The interior of each four segments 71, 72, 73, 74 is removed thereby forming slots in order to form a seat to receive the corresponding X-shaped element 46 from an upper surface of a downwardly successive tray 10. Additionally, the inner portion of segments 71, 72, 73, 74 have a reduced height, and ledge 77 of this reduced height is formed along both sides of segments 71, 72, 73, 74. Typically, ledges 59, 69 and 77 are of equal height.

Support elements 52, 60, 70 typically include bevelled upper (in the configuration or orientation of FIGS. 2 and 4) surfaces and are formed directly below respective support elements 40, 44, 46. Together, the L-, T- and X-shaped elements 52, 60, 70 of the bottom surface 20b define storage pockets 101'-121' (see FIG. 7). When successive trays 10 are stacked, the storage pockets 101-121 defined by the L-, T- and X-shaped elements of the top surface 20b of a tray 10 are in registration with the storage pockets 101'-121' defined by the L-, T- and X-shaped elements of the bottom surface 20b of an adjacent tray 10, to together define 3D enclosures.

Figure 3:
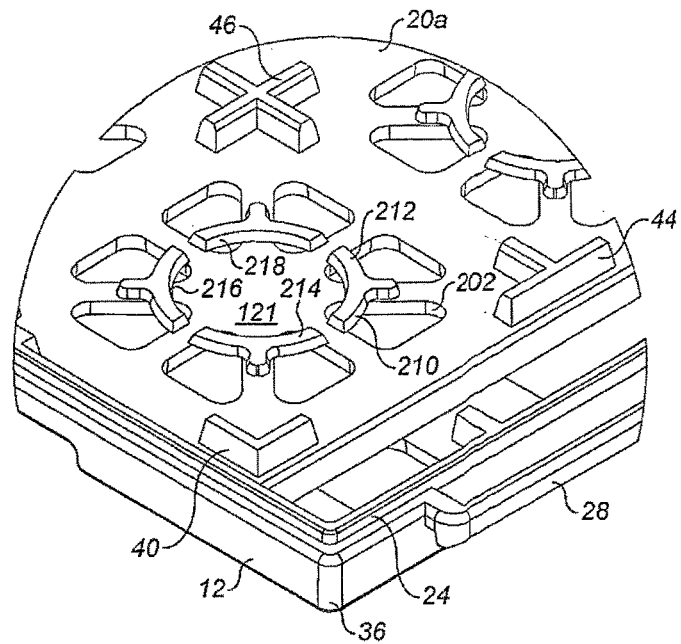
FIG. 3 shows an area of detail of FIG. 1.

As shown in FIGS. 1, 3, and 5, the upper surface or side 20b of tray 10 (which forms the lower surface of the storage pockets 101-121) includes, in each storage pocket other than vacuum storage pockets 109, 111, 113, apertures 202.

Figure 8:
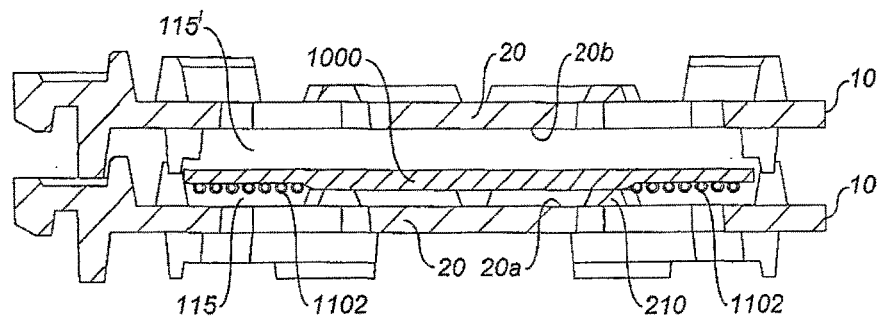
FIG. 8 is a cross-sectional view, formed along the diagonal of a storage pocket formed by two successive trays, showing a ball grid array (BGA) integrated circuit chip secured therein.

As shown in FIG. 8, a component 1000 (here an integrated circuit chip) is captured between successive trays 10 in the 3D enclosure. In some trays 10, a pedestal 210, which may be comprised of rotationally segmented segments 212, 214, 216, 218, each forming approximately a quarter circle, arises from the centre of each storage pocket on the upper surface 20b of the tray 10. Pedestal 210 supports the component 1000 while being sufficiently spaced from the various support elements to allow spherical balls 1002 of the IC chip 1000 to point downwardly without being contacted by pedestal 210 or any other portion. The edges of component 1000 are likewise captured between the corresponding support elements of the successive trays 10.

Figure 9:
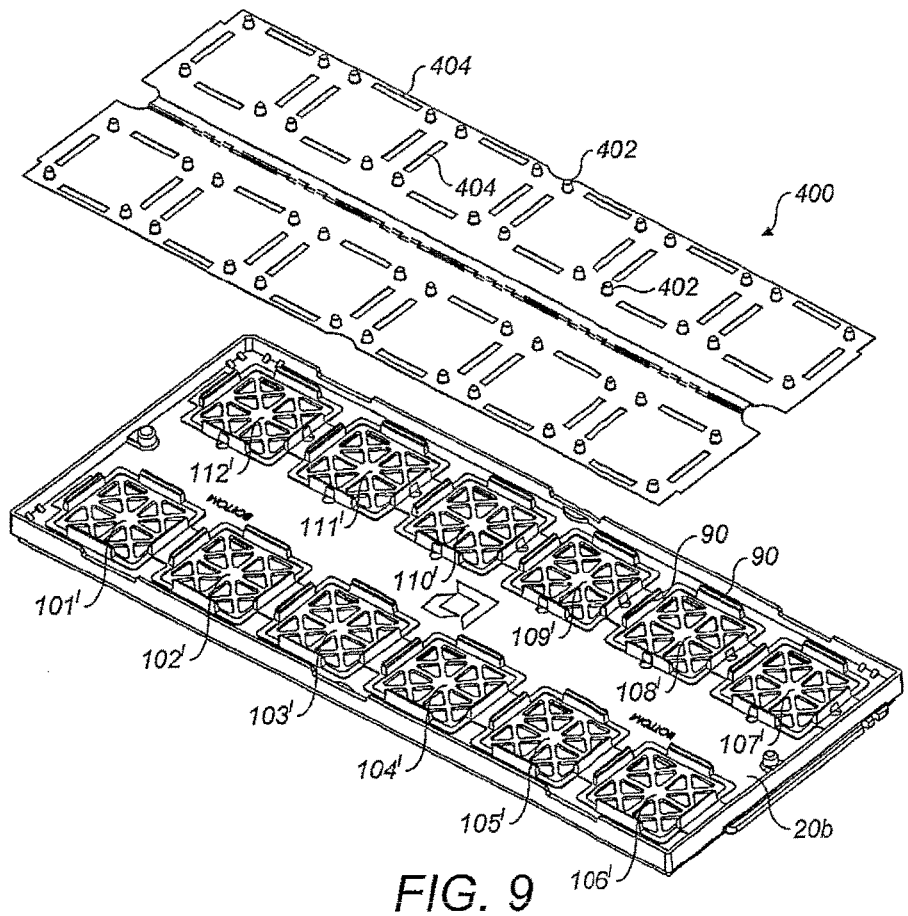
FIG. 9 shows an alternative tray and an associated thermoformed sheet, together comprising a component tray system in accordance with the invention.

An alternative tray 10 is illustrated in FIGS. 9 onwards, in which there are twelve pockets on each of the top and bottom surfaces 20a, 20b. The pockets 101-112 on the top surface 20b are each defined by L-shaped elements 40 at the corners of each pocket. The pockets 101'-112' on the bottom surface 20b are each defined by buttress-like projections 90 extending partially along each side of the respective pockets. Each buttress 90 includes, at a mid-point and projecting outwardly of the associated pocket 101'-112', a wedge 92 which tapers from a thin end 93 intersecting with the buttress at a point at least part way up the buttress 90, to a thick end 95 near the bottom of the buttress 90 (as viewed in FIGS. 10, 12 and 13). The wedge 92 overlies an aperture 96 through the tray 10. Together, each wedge 92 and associated aperture 96 comprise a snap-fit feature. At the distal end of each buttress 90, a ledge 94 is formed facing the associated pocket.

A removable, thermoformed sheet 400 is adapted to cooperate with the tray 10 to reduce at least the depth of the pockets. The sheet 400 is generally planar and comprises a thin sheet of conformal material. The thickness of the sheet is between 0.2 mm and 1.0 mm, which are considered to be practical limits for acceptably accurate thermoforming. Preferably, the sheet thickness is between 0.2 mm and 0.8 mm, which reduced upper limit corresponds to the fact that it becomes impractical to connect the thicker sheets to a tray 10.

The thermoformed sheet 400 includes protrusions 402, such as bumps, studs, bosses, stand-offs, platforms or spikes to vary the profile of the sheet, for a purpose described below.

Figure 10:
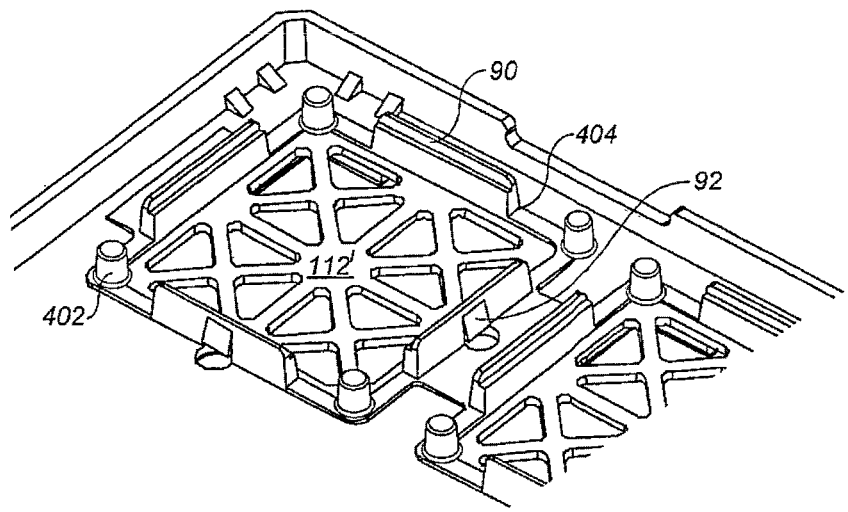
FIG. 10 shows an area of detail of the assembled component tray system, in which the thermoformed sheet is rendered transparent except for protrusion features.
Figure 11A:
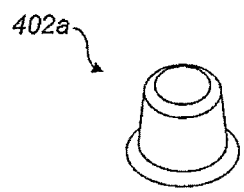
FIGS. 11a-d show alternative protrusion features for the sheet.
Figure 11B:
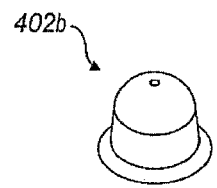
Figure 11C:
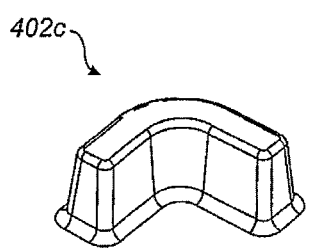
Figure 11D:
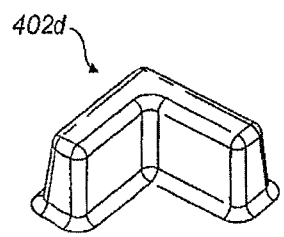
Figure 12:
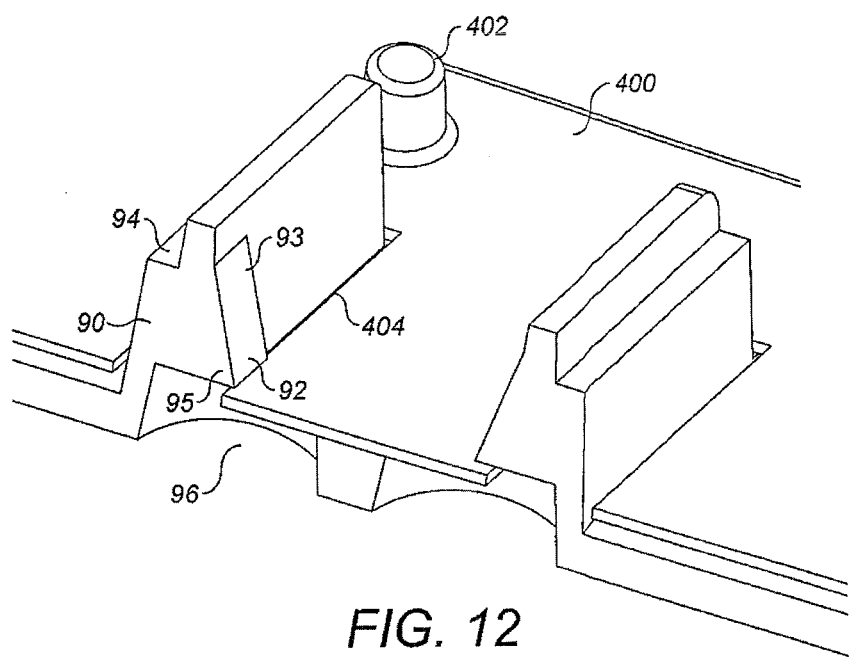
FIG. 12 is an enlarged perspective view illustrating a snap-fit interengagement between the tray and the sheet.
Figure 13:
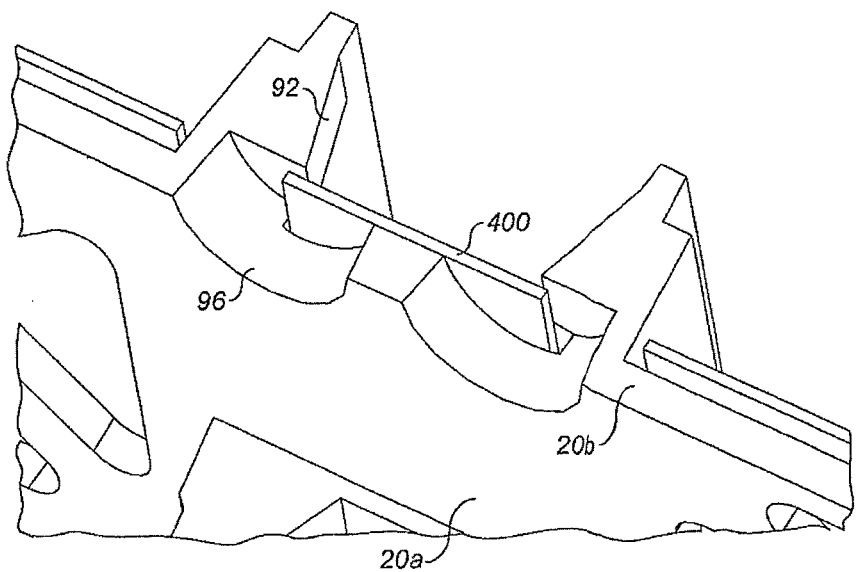
FIG. 13 corresponds to FIG. 12, but from another angle.

The thermoformed sheet 400 also includes slots 404 arranged in a regular array, so as to be in registration with the buttresses 90 of the associated tray 10, as shown in FIG. 10. The thermoformed sheet 400 is attached to the bottom surface 20b of the tray 10 and retained in registration with the tray 10 by a snap-fit between the snap-fit features 90-96 on the tray and the corresponding slots 404 through the sheet 400, as shown in FIGS. 12 and 13. As the sheet 400 is urged into the tray 10, it resiliently deforms when passing the wedges 92 from the thin ends 93 to the thick ends 95 thereof, snapping back to an unstressed state on passing the bottom edges of the wedges 92 and entering the apertures 96, to be retained by those bottom edges. This process can be reversed to remove the sheet 400 from the tray 10, the conformal nature of the sheet allowing it to deform to pass back past the thick ends 95 of the wedges 92.

Of course, alternative arrangements are possible, provided that cooperative interengagement of tray features with corresponding features on the sheet 400 enable both accurate registration of the sheet 400 with the tray 10 and removability of the sheet from the tray. For example, the sheet 400 may be retained on the tray by a snug fit, such as through frictional interference between the pocket-defining features of the tray 10 and the protrusions 402 of the sheet 400, or through frictional interference between the pocket-defining features of the tray 10 and the slots 404 in the sheet 400, in which case the slots are arranged to be a snug fit on the pocket-defining features, such as by the pitching of the pockets on the tray being larger than the pitching of the slots/holes in the sheet. Additionally or alternatively, the frictional interference may be between other studs or protrusions (not shown) on the tray 10 and corresponding holes (not shown) in the sheet 400.

Figure 17:
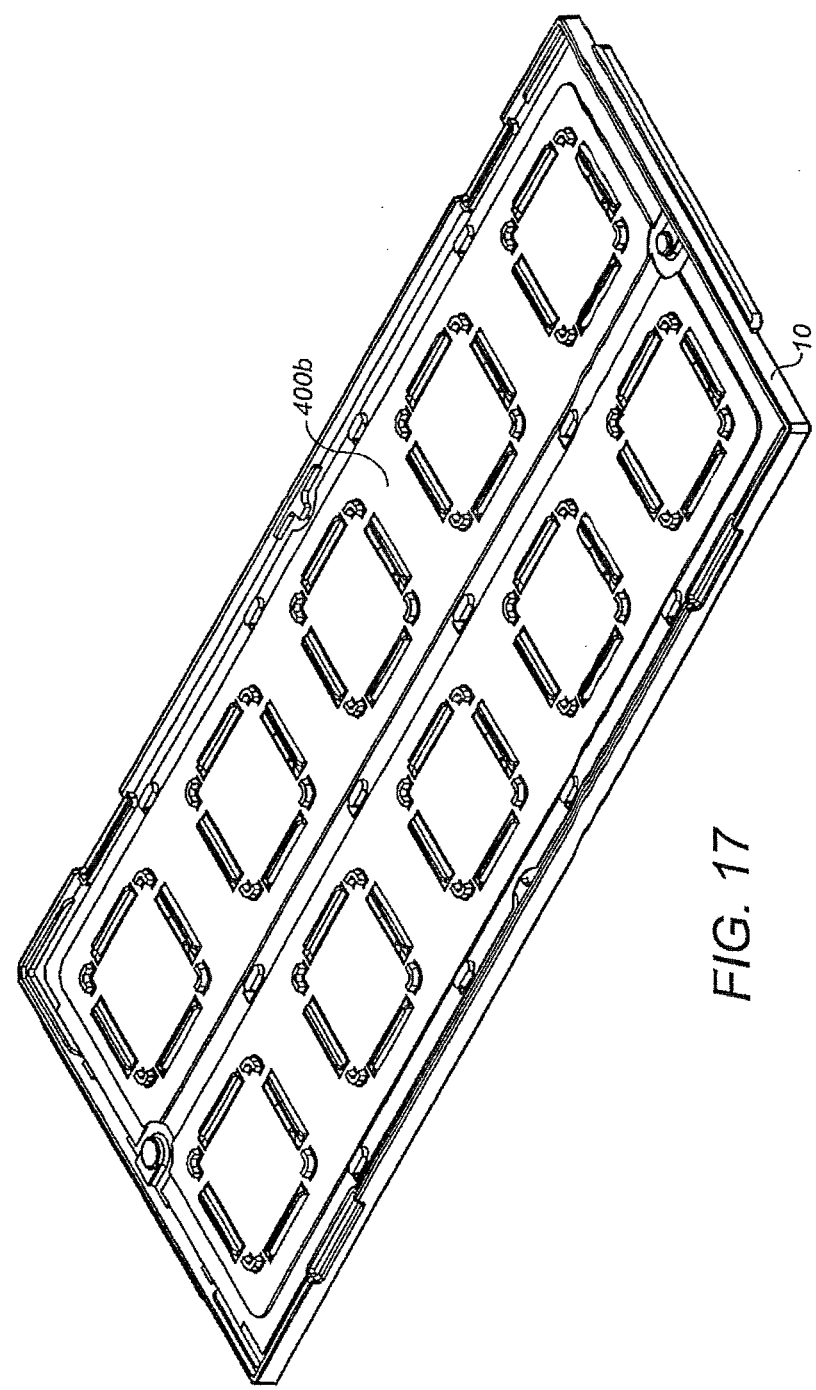
FIG. 17 is a perspective view of an alternative tray and sheet combination, showing sliding capture features.
Figure 18A:
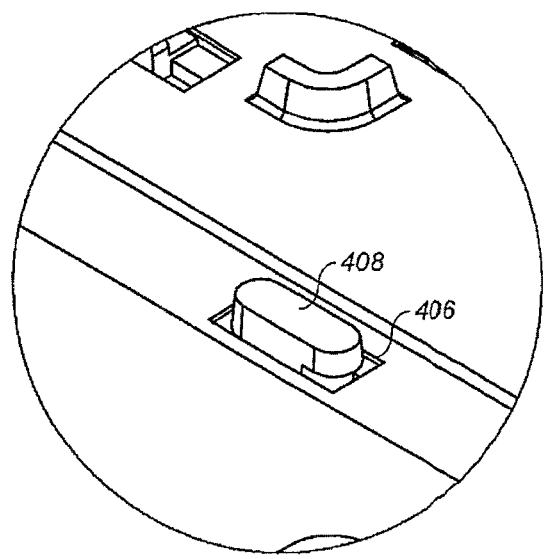
FIGS. 18a and 18b are detail views of the sliding capture features of FIG. 17.
Figure 18B:
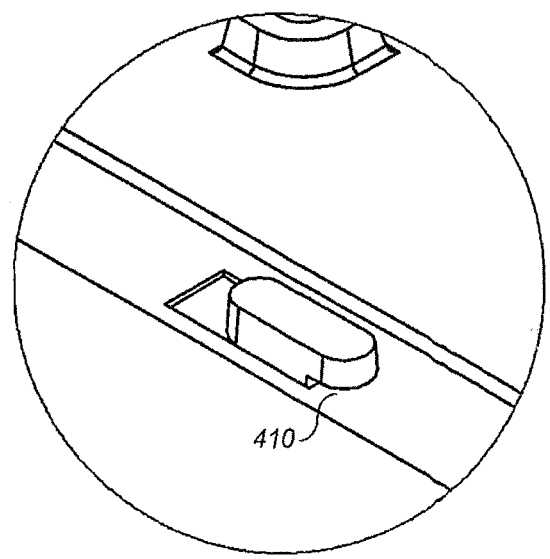

Another way to secure the sheet 400 to the tray 10 would be through the use of a sliding lock feature, as shown in FIGS. 17 and 18, where the sheet 400b provided with slots 406 would slide over corresponding capture features 408 on the tray 10. The slots 406 are each sized and positioned to pass over the respective capture feature 408 when the sheet is pressed toward the tray. Once received over the capture features 408, the sheet is slid in the direction of the slots 406 such that a first end of each slot is received in a facing rebate 410 in the respective capture feature 408. Here, there is no interference fit, just a snug fit.

Figure 14:
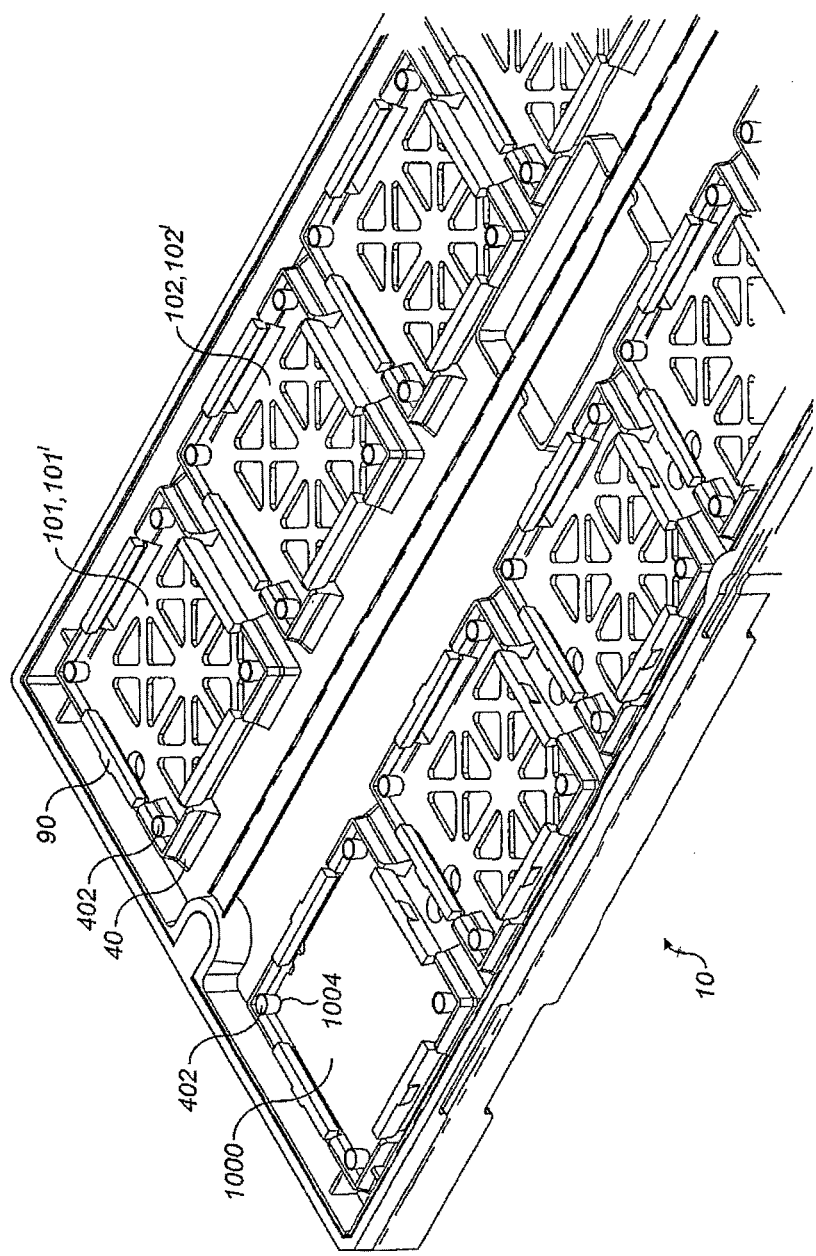
FIG. 14 shows the assembled component tray system, including features from an overlying tray.

The protrusions 402 are arranged in a regular array, so as to be in registration with the pockets 101'-112' of the associated tray 10, thus to reduce at least the depth of those pockets. In some embodiments, the protrusions 402 additionally reduce the width of the pockets 101'-112'. As illustrated, particularly in FIGS. 10 and 14 (in which the sheet 400 is rendered transparent except for the protrusions 402 so as to show only the protrusions 402 in position in registration with each respective pocket), each pocket has associated therewith four protrusions 402, one at each corner. Various alternative protrusions 402a-d are shown in FIGS. 11a-d. This arrangement has the advantage of the protrusions 402 being positioned so as to contact only the corner edges 1004 of the component 1000 within the pocket when, in use, the tray 10 is moved, which portions tend not to be fragile. Also, the shape and configuration of the protrusions 402 can be selected to enhance frictional interference with the pocket defining features of the tray, particularly the L-shaped elements 40.

Most preferably, the sheet thickness is 0.3 mm, which enables good formation of protrusion features 402 with good dimensional stability and at a low cost. In general, thermoform process variations increase with sheet thickness. Also, thin sheets are less expensive than thicker sheets.

Figure 15:
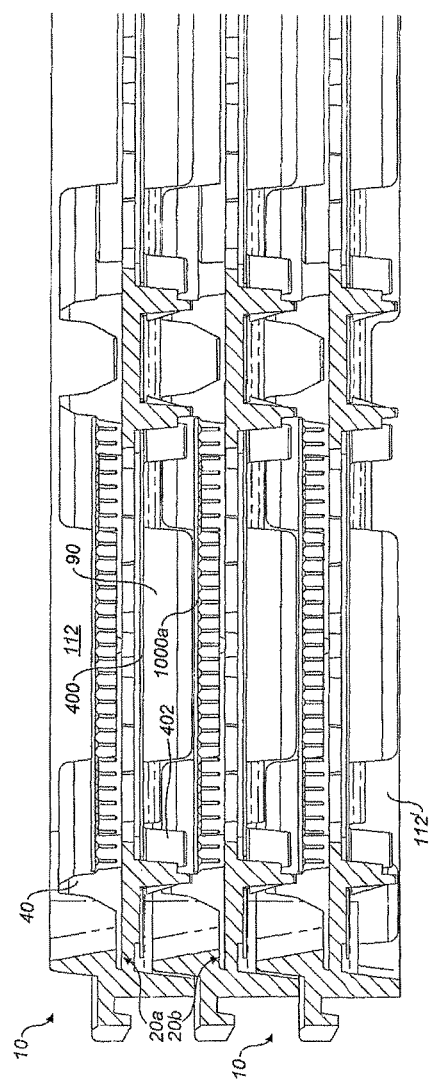
FIG. 15 is a cross-sectional view of a stack of assembled component tray systems.

The tray 10 and sheet 400 together comprise a component tray system for use in a method of manufacturing components 1000. According to the method, a thermoformed sheet 400 is attached to the bottom surface 20b of a tray 10 as described above, thereby reducing at least the depth of the pockets 101'-112' of the tray 10. First components 1000a, such as bare substrates, having a first size are inserted into the pockets 101-112 on the top side 20b of an underlying tray 10, in a "live bug" orientation. Once loaded with the first components, the tray 10 with the sheet 400 attached to its bottom surface 20b can be stacked on top of the underlying tray 10, as shown in FIG. 15. The facing pockets 101'-112' and 101-112 of the respective trays define respective 3D enclosures in which the first components 1000b are retained snugly by virtue of the reduced depth pockets 101'-112' due to the presence of the sheet 400 and, particularly, the protrusions 402.

Figure 16A:
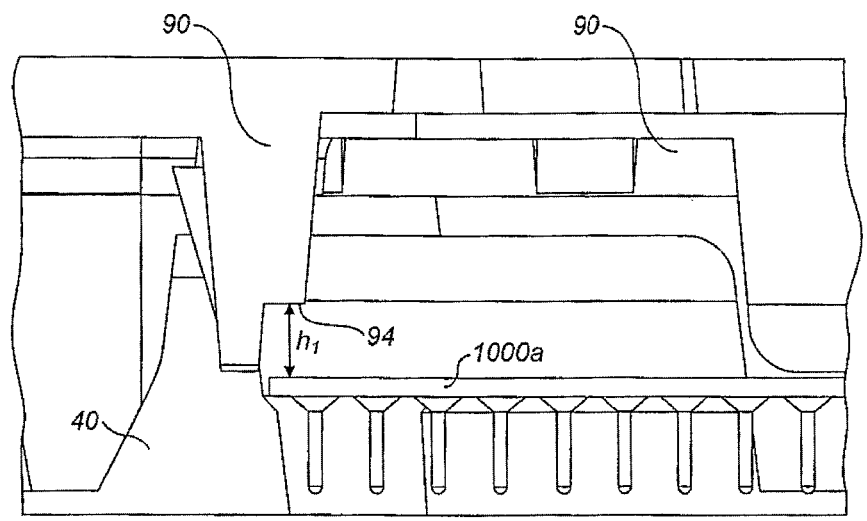
FIGS. 16a and 16b show by comparison, the difference in pocket depth achieved respectively without and with the use of the sheet.
Figure 16B:
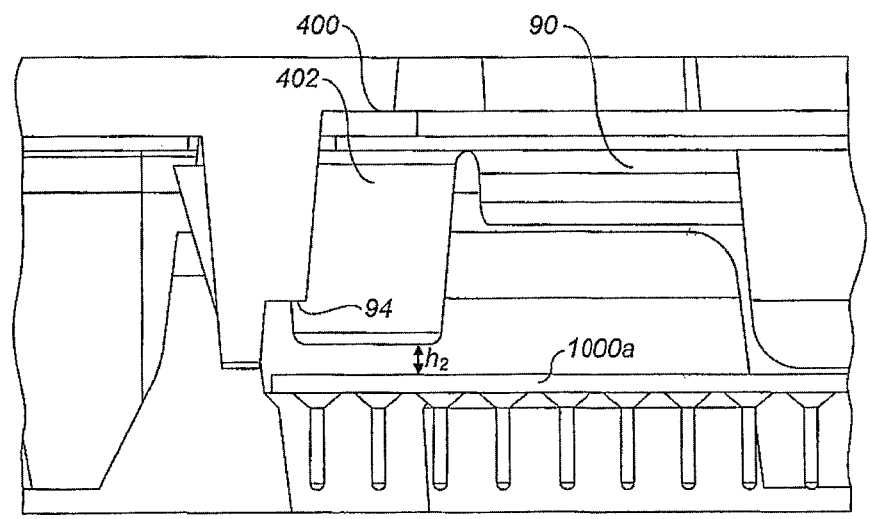

This reduced depth is shown in FIGS. 16a and b, where FIG. 16a shows the first component 1000b in the large 3D enclosure formed by original sized pockets. Since the 3D enclosure is designed to accommodate larger components, the z-axis spacing $h_1$ between the first component 1000b and the ledges 94 of the buttresses 90 is relatively large and would not hold the first component snugly within the enclosure. The reduced z-axis spacing $h_2$ provided by the protrusions 402 on the sheet 400 is shown in FIG. 16b. This reduced spacing $h_2$ is effective to retain the first component snugly within the 3D enclosure.

After loading, the stacked trays 10 can be moved to another location.

There, the first components 1000b within the pockets 101-112 of a particular tray 10 are exposed in a "live bug" configuration by the removal of the overlying tray or trays 10, and a manufacturing operation is performed on the first components 1000b to produce respective second components (not shown) having a second size, greater than said first size. In a typical manufacturing operation, the first components 1000b would be removed from the pockets 101-112 with a pick-and-place technique, for remote processing. However, the manufacturing operation could take place with the first components 1000b in situ in the pockets.

In order to accommodate the larger second components, the or each thermoformed sheet 400 is removed from the bottom surface 20b of the overlying tray 10, thus restoring the pockets 101'-112' and the associated 3D enclosures to their original dimensions, as defined by the tray features. Thus, the overlying tray 10 can once again be stacked on top of the tray 10 containing the processed, second components.

The manufacturing operation might alternatively take place with the first components 1000b in a "dead bug" orientation, whereby the stacked trays 10 are first inverted before the first components 1000b within the pockets 101'-112' of a particular tray 10 are exposed in the "dead bug" configuration by the removal of the overlying tray or trays 10, which were previously the underlying trays. The sheet 400 can then be removed from the tray 10 in which the components 1000b are exposed by replacing the overlying tray or trays, inverting the stacked trays, removing the overlying tray (i.e. the one to which the sheet 400 is attached), and replacing the sheetless tray as with the "live bug" method.

In one embodiment, the sheet 400 is attached to the top surface 20b of a tray rather than to the bottom surface 20b of an overlying tray. In this instance, the sheet attachment must occur before the insertion of the first components 1000b into the pockets 101-112. In this way, the dimensions of the pockets 101-112 are reduced and the first components 1000b can be inserted into the reduced sized pockets 101-112. This is especially advantageous where the sheet 400 is for altering the width of the pockets 101-112 as well as their depth, because this addresses registration problems that might occur if the first components 1000b are instead loosely inserted into the full size pockets 101-112 with the sheet 400 then being overlaid to reduce the pocket size (by the stacking of an overlying tray 10).

Alternatively, the components 1000b may be inserted into the pockets 101'-112' of an inverted tray 10 before an inverted overlying tray having the sheet attached is stacked on top.

Where the sheet 400 is attached to the bottom surface 20b of an overlying tray, it can be removed at any time during or after the manufacturing operation, irrespective of whether the components 1000 are within the pockets 101-112 at the time. The sheet 400 is removed either by hand or by a removal mechanism. On the other hand, where the sheet 400 is attached to the top surface 20b of a tray, it is necessary for the first components 1000b to be removed from the pockets 101-112 before the sheet 400 can be removed. Alternatively, the trays 10 could be inverted before the manufacturing operation, so that the first components 1000b are instead retained in the pockets 101'-112' of the overlying tray 10 (which is now underlying), freeing the sheet 400 for removal and exposing the first components 1000a.

The thermoformed sheet 400 may further include indented portions, such as channels, and/or further apertures, such as slots or holes (not shown), so as to avoid contact between the sheet and portions of the components 1000, particularly fragile portions.

Although it is preferable to include protrusions 402, the depth of the pockets can alternatively just be altered by providing a relatively thick conformal sheet.

Whereas just first and second components have been described, further intermediate stages of processing can be envisaged, and additional sheets having features tailored to those intermediate components could also be provided.

Moreover, the facing pockets 101-112 in the top surface 20b can also be fitted with a thermoformed sheet to alter the internal dimensions of those facing pockets. The sheet may be a continuation of the sheet 400 that is attached to the bottom surface 20b of that tray, or might be a second sheet.

Although the foregoing description has been made with reference to a particular tray 10 complying with the JEDEC standard, it will be understood that the tray 10 may take a different configuration, such as a having a different number of pockets, the pockets being of a different shape, or the internal features defining the pockets taking a different form. In particular, it should be understood that the invention applies to any non-standard trays that are adapted to convey, protect and transport electronic and electric components. Moreover, the invention is not limited to application with JEDEC trays, and could equally be applied to trays complying with other known standards, as discussed in the introductory portion.

The sheet 400 may not affect the depth and/or width of all pockets, but may be tailored instead to alter the dimensions of a selected pocket or pockets.

The invention claimed is:

1. A component tray system, the system comprising:
   a tray having one or more pockets, the or each pocket adapted to receive at least one component; and,
   a removable, thermoformed sheet adapted to cooperate with said tray to reduce at least the depth of said one or more pockets,
   wherein at least one of:
   (i) the sheet is devoid of pockets; or
   (ii) the sheet has a length, a width and a height, wherein the height is the smallest dimension and the length is the longest dimension, wherein a path exists from one end of the sheet on one end of the sheet, relative to the length of the sheet, to an opposite end of the sheet, again relative to the length of the sheet, wherein the path is located entirely on the same plane from one end to the other end, wherein the plane is a plane upon which a majority of one side of the sheet lies, and the sheet includes a plurality of protrusions extending from a surface of the sheet.

2. The component tray system of claim 1, wherein the tray has a top surface and a bottom surface, pockets being defined on either or both of the top and bottom surfaces.

3. The component tray system of claim 2, wherein the thermoformed sheet is adapted to cooperate with the top surface or the bottom surface.

4. The component tray system of claim 1, wherein the thermoformed sheet includes protrusions, such as bumps, studs, bosses, stand-offs, platforms or spikes to vary the profile of the sheet, thus to reduce at least the depth of said one or more pockets.

5. The component tray system of claim 4, wherein the protrusions further reduce the width of said one or more pockets.

6. The component tray system of claim 4, wherein the protrusions are positioned so as to contact only non-fragile portions of the at least one component when, in use, the tray is moved.

7. The component tray system of claim 1, wherein the thermoformed sheet includes indented portions, such as channels, and/or apertures, such as slots or holes.

8. The component tray system of claim 1, wherein the thermoformed sheet is retained in registration with the tray by cooperative interengagement of tray features with corresponding features on the sheet.

9. The component tray system of claim 8, wherein the cooperative interengagement comprises a snap-fit.

10. The component tray system of claim 8, wherein the cooperative interengagement comprises a snug fit.

11. The component tray system of claim 1, wherein the thickness of the sheet is 0.3 mm.

12. The component tray system of claim 1, wherein:
    the one or more pockets are located on a first side of the tray,
    the component tray system includes another tray having a first side and a second side, the second side facing the first side of the tray, the another tray also having one or more pockets, the or each pocket of the another tray being adapted to receive at least one component;
    at least one first component having a first size is located in the or each pocket on the first side of the another tray;
    the tray is stacked on top of the another tray such that the thermoformed sheet is in registration with said another tray thereby reducing at least the depth of said one or more pockets, the at least one first component being retained snugly there within by virtue of the sheet.

13. The component tray system of claim 1, wherein the thickness of the sheet is between 0.2 mm and 0.8 mm.

14. The component tray system of claim 1, wherein the thickness of the sheet is between 0.2 mm and 1.0 mm.

15. The component tray system of claim 1, wherein the thermoformed sheet is made of a conformal material.

16. The component tray system of claim 1, wherein the sheet includes a plurality of protrusions extending from a surface of the sheet arrayed in a generally uniform manner.

17. The component tray system of claim 1, wherein the sheet includes at least 24 protrusions extending from a surface of the sheet arrayed in a generally uniform manner.

18. The component tray system of claim 1, wherein the tray has a length, a width and a height, the height being the smallest dimension, wherein the maximum thickness of the sheet is less than the maximum thickness of the tray.

19. The component tray system of claim 1, wherein the tray has a length, a width and a height, the height being the smallest dimension, wherein the length and width of the sheet is at least about the same as the length and the width of the tray.

20. The component tray system of claim 1, wherein the tray includes a plurality of buttresses, the thermoformed sheet includes a plurality of slots therein, wherein the slots are in registration with respective buttresses.

21. The component tray system of claim 1, wherein the tray includes a plurality of groups of buttresses, respective groups of buttresses including four buttresses arrayed in a rectangular pattern, wherein the thermoformed sheet includes a plurality groups of slots therein arrayed in a rectangular pattern, respective groups of slots including four slots, wherein the slots are in registration with respective buttresses.

22. The component tray system of claim 1, wherein the thermoformed sheet includes a plurality of slots therein.

23. The component tray system of claim 1, wherein the thermoformed sheet includes a plurality of rectangular openings having a length and a width in the plane of the sheet, the length being longer than the width.

24. The component tray system of claim 1, wherein the tray is made of at least one of PPO, PPE, PP, PC, PSU, PES, PAS or ABS.

25. The component tray system of claim 1, wherein the tray is made of at least one of talc, carbon fibre, carbon powder or metal fibre.

26. The component tray system of claim 1, wherein the thermoformed sheet is generally planar, wherein first portions thereof that reduce at least the depth of said one or more pockets are on a same plane as second portions thereof that are between the first portions.

27. The component tray system of claim 1, wherein the sheet is devoid of pockets.

28. The component tray system of claim 1, wherein the sheet has the length, the width and the height, wherein the height is the smallest dimension and the length is the longest dimension, wherein the path exists from one end of the sheet on one end of the sheet, relative to the length of the sheet, to the opposite end of the sheet, again relative to the length of the sheet, wherein the path is located entirely on the same plane from one end to the other end, wherein the plane is the plane upon which a majority of one side of the sheet lies.

29. The component tray system of claim 28, wherein the sheet includes the plurality of protrusions extending from the surface of the sheet.

30. The component tray system of claim 1, wherein the thermoformed sheet includes a plurality of rectangular through passages extending completely from a first side of the sheet to a second side of the sheet having a length and a width in the plane of the sheet, the length being longer than the width.

\* \* \* \* \*